United States Patent
Ikehara et al.

(10) Patent No.: US 7,136,409 B2
(45) Date of Patent: Nov. 14, 2006

(54) SEMICONDUCTOR LASER DEVICE AND OPTICAL PICKUP DEVICE

(75) Inventors: Masahiro Ikehara, Nara (JP); Katsushige Masui, Nara (JP); Kazuhiro Tsuchida, Kashihara (JP); Keiji Sakai, Nara (JP)

(73) Assignee: Sharp Kabushiki Kaisha, Osaka (JP)

(*) Notice: Subject to any disclaimer, the term of this patent is extended or adjusted under 35 U.S.C. 154(b) by 0 days.

(21) Appl. No.: 10/812,317

(22) Filed: Mar. 30, 2004

(65) Prior Publication Data
US 2004/0202224 A1  Oct. 14, 2004

(30) Foreign Application Priority Data
Mar. 31, 2003 (JP) .............................. 2003-094196

(51) Int. Cl.
H01S 3/08 (2006.01)
G11B 7/12 (2006.01)

(52) U.S. Cl. ...................... 372/102; 369/109
(58) Field of Classification Search .................. 372/43, 372/102; 369/109, 103, 112
See application file for complete search history.

(56) References Cited

U.S. PATENT DOCUMENTS

| | | | |
|---|---|---|---|
| 5,428,595 A | | 6/1995 | Yoshida et al. |
| 5,475,670 A * | 12/1995 | Hamada et al. ......... 369/112.07 |
| 5,481,524 A * | 1/1996 | Ueno et al. ............ 369/112.07 |
| 5,684,779 A * | 11/1997 | Ohuchida et al. ...... 369/112.12 |
| 5,838,651 A * | 11/1998 | Takahashi ............... 369/109.02 |
| 6,072,607 A * | 6/2000 | Tajiri et al. .................... 359/15 |
| 6,278,548 B1 * | 8/2001 | Shimano et al. ............. 359/565 |
| 6,556,532 B1 * | 4/2003 | Ogawa et al. ......... 369/112.16 |
| 6,868,055 B1 * | 3/2005 | Ueyama et al. ........ 369/112.15 |
| 2002/0024916 A1 * | 2/2002 | Ueyama et al. ........ 369/112.04 |
| 2002/0093893 A1 | 7/2002 | Matsuda |
| 2002/0097660 A1 * | 7/2002 | Komma et al. ........ 369/112.04 |
| 2002/0163874 A1 | 11/2002 | Nakanishi et al. |
| 2004/0156299 A1 * | 8/2004 | Sakai et al. ............... 369/112.1 |
| 2005/0135202 A1 * | 6/2005 | Ogawa .................... 369/13.12 |
| 2005/0162995 A1 * | 7/2005 | Fukasawa et al. ....... 369/44.23 |

FOREIGN PATENT DOCUMENTS

| | | |
|---|---|---|
| JP | 5-205295 | 8/1993 |
| JP | 2001-273666 | 10/2001 |
| JP | 2003-16667 | 1/2003 |
| WO | WO 03/041066 | 5/2003 |

OTHER PUBLICATIONS

CN 1338735 A (U.S. counterpart is US 2002/0093893) listed above.
CN 1388960 A (U.S. counterpart is US 2002/0163874) listed above.
Chinese Office Action mailed Jul. 8, 2005 (w/English Translation thereof).

* cited by examiner

Primary Examiner—Don Wong
Assistant Examiner—Hung Tran Vy
(74) Attorney, Agent, or Firm—Nixon & Vanderhye P.C.

(57) ABSTRACT

In this semiconductor laser device, a polarization hologram transmits an outgoing beam directed from a semiconductor laser chip to an optical disk as a forward beam without diffracting the beam, and diffracts a backward beam of the laser beam, which is a return beam of the forward beam that has been reflected by the optical disk, so that the backward beam is deflected from a direction directed toward the semiconductor laser chip part and further directed toward first, second photoreception parts. Therefore, optical loss on the forward way from the semiconductor laser chip to the optical disk can be reduced, and return light to the semiconductor laser chip can be suppressed, so that a high-power, high-sensitivity semiconductor laser device can be realized.

13 Claims, 6 Drawing Sheets

SEMICONDUCTOR LASER DEVICE AND OPTICAL PICKUP DEVICE

This nonprovisional application claims priority under 35 U.S.C. §119 (a) on Patent Application No. 2003-094196 filed in Japan on Mar. 31, 2003, the entire contents of which are hereby incorporated by reference.

BACKGROUND OF THE INVENTION

The present invention relates to semiconductor laser devices and optical pickup devices, for example, to a semiconductor laser device and an optical pickup device which are suitable for use in an optical disk apparatus which optically records or reproduces information to or from information recording mediums such as optical disks.

With a view to smaller size, thinner thickness and higher reliability of optical pickup devices, there has been an optical pickup device equipped with a hologram element. FIG. 8 shows an example of a semiconductor laser device equipped with a hologram element to constitute an optical pickup device.

In this semiconductor laser device, a laser beam 107 emitted by a semiconductor laser chip 101 is first diffracted by a grating element 103. It is noted that the semiconductor laser chip 101 is placed on a stem 106, and the grating element 103 is placed on a hologram element/grating element positioning cap 105. Out of the diffracted light diffracted by this grating element 103, a 0th-order diffracted beam 108A is used for signal detection and ±1st-order diffracted beams 108B, 108C are used for tracking signal detection.

However, the 0th-order diffracted beam 108A and ±1st-order diffracted beams 108B, 108C diffracted by this grating element 103, during passage through a hologram element 104 on a forward way lead to a disk (not shown), which is an object of irradiation, are diffracted by the hologram element 104. Then, only a 0th-order diffracted beam 109 by this hologram element 104 can be used as a signal. In addition, ±1st-order diffracted beams 110A, 110B by the hologram element 104 result in loss components.

The 0th-order diffracted beam 109 by the hologram element 104 is diffracted again by the hologram element 104 on the backward way from the disk, becoming a 1st-order diffracted beam 111, which is converged to a photoreceptive portion of a photodetector 102.

It is well known that, on the backward way from the disk, the 0th-order diffracted beam that has passed through the hologram element 104 is not only useless for signal detection, but makes a cause of noise due to its return to the laser chip 101.

Also, in an optical pickup device equipped with the above-described semiconductor laser device, there would arise problems as follows.

On the forward way, none of the ±1st- and higher-order diffracted beams diffracted at the passage of the holographic pattern of the hologram element 104 lend themselves to signal detection. That is to say, they make a loss component. Therefore, it is necessary to increase the power of the laser beam emitted by the laser chip 101 to an extent corresponding to the loss component.

As a result, the ratio of the 0th-order diffracted beam in the hologram element 104 would necessarily be set to a high one, whereas, in this case, the diffraction efficiency in the hologram element 104 on the backward way would inevitably become lower, so that the signal intensity by the diffracted beam diffracted toward the photoreceptor 102 would inevitably become lower. Further, since the hologram element 104 has a high ratio of the 0th-order diffracted beam, the ratio of the backward beam from the disk to the laser chip 101 would also be high, making a cause of noise as described above, which leads to a difficulty in use.

As it stands, the write speed onto the disk is constrained primarily by laser power. Therefore, on the forward way, the write speed is limited by the loss of light diffracted by the holographic pattern of the hologram element 104, and a reduction in optical loss on the forward way is required to achieve higher-speed write operations.

SUMMARY OF THE INVENTION

Accordingly, an object of the present invention is to provide a semiconductor laser device and an optical pickup device either of which is capable of reducing the optical loss on the forward way from the laser emission part and moreover suppressing return light to the laser emission part, and either of which is of high power and high sensitivity.

In order to achieve the above object, according to the present invention, there is provided a semiconductor laser device comprising:

a laser emission part for emitting a laser beam;

a laser reception part for receiving a backward beam of the laser beam reflected by an irradiation object;

a polarization hologram for transmitting the laser beam directed from the laser emission part to the irradiation object as a forward beam without diffracting the beam, and diffracting a backward beam of the laser beam, which is a return beam of the forward beam that has been reflected by the irradiation object, so that the backward beam is deflected from a direction directed toward the laser emission part and further directed toward the laser reception part; and a three-beam diffraction grating for dividing a holographic diffracted beam, which results from the diffraction of the backward beam by the polarization hologram, into three beams and for letting the beam incident on the laser reception part.

In this invention, the polarization hologram transmits the laser beam directed from the laser emission part to the irradiation object as a forward beam without diffracting the laser beam, and diffracting a backward beam of the laser beam, which is a return beam of the forward beam that has been reflected by the irradiation object, so that the backward beam is deflected from a direction directed toward the laser emission part and further directed toward the laser reception part. Therefore, according to this invention, optical loss on the forward way from the laser emission part can be reduced, and moreover return light to the laser emission part can be suppressed, thus making it possible to realize a high-power, high-sensitivity semiconductor laser device.

Also, in the semiconductor laser device of this invention, the three-beam diffraction grating divides a holographic diffracted beam, which results from the diffraction of the backward beam by the polarization hologram, into three beams and lets the beam incident on the laser reception part. Therefore, in this semiconductor laser device, there is no need for placing the three-beam diffraction grating on the forward way of the laser beam, so that a tracking signal can be obtained by reception of the three-beam-divided holographic diffracted beams by means of the laser photoreception part without incurring any power loss of the forward beam of the laser beam.

In one embodiment of the semiconductor laser device, the polarization hologram is so designed that 0th-order diffracted beams are generally null relative to the backward beam.

In the semiconductor laser device of this embodiment, since the polarization hologram outputs generally null 0th-order diffracted beams relative to the backward beam, the backward beam directed from the polarization hologram toward the laser emission part is generally eliminated, thus making it possible to avoid generation of noise at the laser emission part due to the backward beam.

Also, in one embodiment, the polarization hologram and the three-beam diffraction grating are integrated together.

In the semiconductor laser device of this embodiment, since the polarization hologram and the three-beam diffraction grating are integrated together, the semiconductor laser device can be downsized as an integrated unit.

In one embodiment, the three-beam diffraction grating is so positioned that the forward beam directed from the laser emission part toward the irradiation object is inhibited from being incident on the three-beam diffraction grating.

In the semiconductor laser device of this embodiment, the three-beam diffraction grating does not intercept the forward beam of the laser beam, and so a tracking signal can be obtained by reception of the holographic diffracted beams, which have been divided into three beams by the three-beam diffraction grating, with the laser photoreception part without incurring any power loss of the forward beam.

In one embodiment, the laser reception part includes a first photoreception part for receiving a +1st-order diffracted beam derived from the polarization hologram, and a second photoreception part for receiving a −1st-order diffracted beam derived from the polarization hologram.

In the semiconductor laser device of this embodiment, information contained in the +1st-order diffracted beam and information contained in the −1st-order diffracted beam can be detected as different kinds of information by the first photoreception part and the second photoreception part, independently of each other. For example, in the case where high-band signals, which are information signals, are contained in the −1st-order diffracted beam and servo signals that does not need any high band are contained in the +1st-order diffracted beam, the information signals can be detected by the second photoreception part and the servo signals can be detected by the first photoreception part. As a result, it becomes implementable to realize a semiconductor laser device of high efficiency for light utilization.

Also, in one embodiment, the semiconductor laser device has a three-beam diffraction grating for dividing into three beams either one of the +1st-order diffracted beam or the −1st-order diffracted beam derived from the polarization hologram.

In the semiconductor laser device of this embodiment, by the three-beam diffraction grating that divides into three beams either one of the +1st-order diffracted beam or the −1st-order diffracted beam derived from the polarization hologram, it becomes possible to obtain a tracking signal without placing the three-beam diffraction grating on the forward way of the laser beam emitted by the laser emission part.

In the semiconductor laser device of one embodiment, the grating pitch of the three-beam diffraction grating is constant.

In the semiconductor laser device of this embodiment, since the grating pitch of the three-beam diffraction grating is constant, the three-beam division characteristic of this three-beam diffraction grating is a constancy in a direction along which the grates are arrayed. Therefore, the backward beam incident on the three-beam diffraction grating from the polarization hologram is divided into three beams in similar characteristics irrespectively of the positions at which the grates are arrayed.

In one embodiment, the three-beam diffraction grating varies in diffraction efficiency depending on positions in a grating-extension direction along which the grating extends.

In the semiconductor laser device of this embodiment, the three-beam diffraction grating varies in diffraction efficiency depending on positions in the grating-extension direction along which the grating extends. Therefore, by detecting the backward beam that has passed through the three-beam diffraction grating and that is derived from the polarization hologram by means of the laser photoreception part, positional changes in the grating-extension direction of the backward beam that is derived from the polarization hologram and that is incident on the three-beam diffraction grating can be detected.

According to one embodiment, in the three-beam diffraction grating, a land width to groove width ratio of land portions and groove portions which constitute the grating continuously varies along the grating-extension direction.

In the semiconductor laser device of this embodiment, a land width to groove width ratio of land portions and groove portions which constitute the grating continuously varies along the grating-extension direction in the three-beam diffraction grating. As a result, the diffraction efficiency can be continuously varied in the grating-extension direction.

According to one embodiment, in the three-beam diffraction grating, groove depth of the grating continuously varies along the grating-extension direction.

In the semiconductor laser device of this embodiment, groove depth of the grating continuously varies along the grating-extension direction in the three-beam diffraction grating. As a result, the diffraction efficiency can be continuously varied in the grating-extension direction.

According to one embodiment, in the three-beam diffraction grating, groove depth of the grating varies stepwise along the grating-extension direction.

In the semiconductor laser device of this embodiment, groove depth of the grating varies stepwise along the grating-extension direction in the three-beam diffraction grating. As a result, the diffraction efficiency can be varied stepwise in the grating-extension direction.

Further, in one embodiment, there is provided an optical pickup device equipped with the above-described semiconductor laser device.

In the optical pickup device of this embodiment, by the equipment of the semiconductor laser device, optical loss on the forward way from the laser emission part can be reduced, and moreover return light to the laser emission part can be suppressed, thus making it possible to realize a high-power, high-sensitivity optical pickup device.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Hereinbelow, embodiments of the present invention are described with reference to the accompanying drawings.

Figure 1:
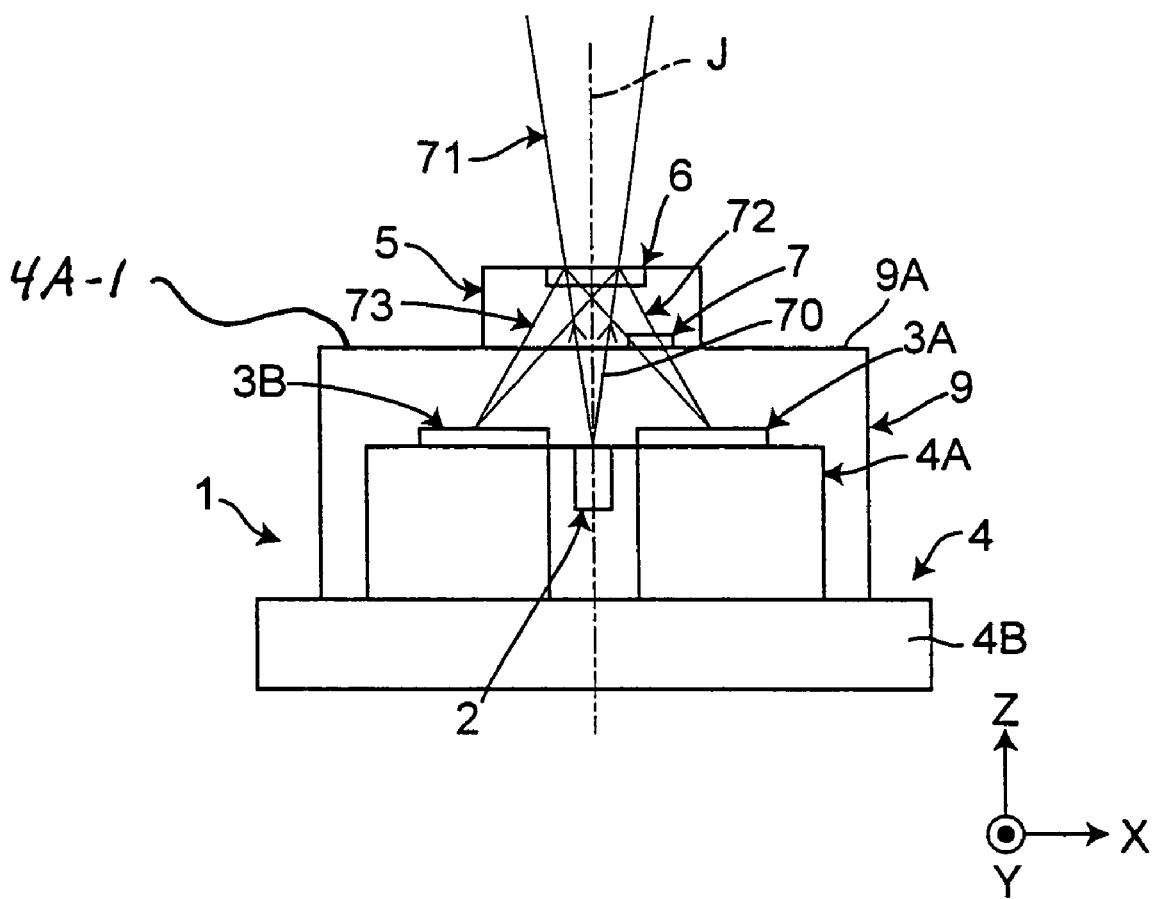
FIG. 1 is a view outlining the schematic construction of an embodiment of the semiconductor laser device according to the present invention.

FIG. 1 shows the construction of an embodiment of the semiconductor laser device according to the present invention.

This semiconductor laser device 1 has a semiconductor laser chip 2 as a laser emission part, and first photoreception part 3A and second photoreception part 3B which are disposed on both sides of the semiconductor laser chip 2 so as to be spaced from this semiconductor laser chip 2 by a specified distance in an X-axis direction. These first photoreception part 3A and second photoreception part 3B constitute a laser reception part.

The semiconductor laser chip 2 is mounted on a mounting part 4A of a stem 4, and the first photoreception part 3A and the second photoreception part 3B mounted on an upper surface 4A-1 of the mounting part 4A of the stem 4.

Also, this semiconductor laser device 1 has a cap part 9 which covers the mounting part 4A of the stem 4, the semiconductor laser chip 2, the first photoreception part 3A and the second photoreception part 3B and which is fitted to a base part 4B of the stem 4. On a top face 9A of this cap part 9 is mounted an optical element 5. In this optical element 5, a polarization hologram 6 as a polarization diffraction grating is formed on its upper surface, and a three-beam diffraction grating 7 is formed on its lower surface.

The polarization hologram 6 is so positioned that an output optical axis J of a laser beam (forward beam 71) outputted by the semiconductor laser chip 2 extends generally through the center of the polarization hologram 6. Also, the three-beam diffraction grating 7 is shifted along the X-axis direction with respect to the polarization hologram 6 so that the forward beam 71 outputted by the semiconductor laser chip 2 does not go incident thereon. Also, this three-beam diffraction grating 7 is so positioned that +1st-order diffracted beam 72 from the polarization hologram 6 goes incident thereon. Further, the first photoreception part 3A is so positioned that the +1st-order diffracted beam 72 incident on the three-beam diffraction grating 7 goes incident on the first photoreception part 3A.

Also, the second photoreception part 3B is so positioned that −1st-order diffracted beam 73 from the polarization hologram 6 goes incident on the second photoreception part 3B.

In the semiconductor laser device 1 of this embodiment, the optical element 5, the cap part 9 and the stem 4 are integrated together, and the semiconductor laser chip 2, the first photoreception part 3A, the second photoreception part 3B, the polarization hologram 6 and the three-beam diffraction grating 7 are integrated together.

In this embodiment, the output beam 70 outputted from the semiconductor laser chip 2, which is the light emitting part, is transmitted as the forward beam 71 by the polarization hologram 6, then being incident on the optical disk, which is the object of irradiation. Reflected light from this optical disk, becoming a backward beam 77, goes incident again on the polarization hologram 6. The backward beam 77 is diffracted by the polarization hologram 6 so as to be divided into ±1st-order diffracted beams 72, 73. Out of these ±1st-order diffracted beams 72, 73, the +1st-order diffracted beam 72 goes incident on the three-beam diffraction grating 7, being diffracted so as to go incident on the first photoreception part 3A. Meanwhile, out of the ±1st-order diffracted beams 72, 73, the −1st-order diffracted beam 73, not passing through the three-beam diffraction grating 7, goes incident on the second photoreception part 3B.

Figure 2:
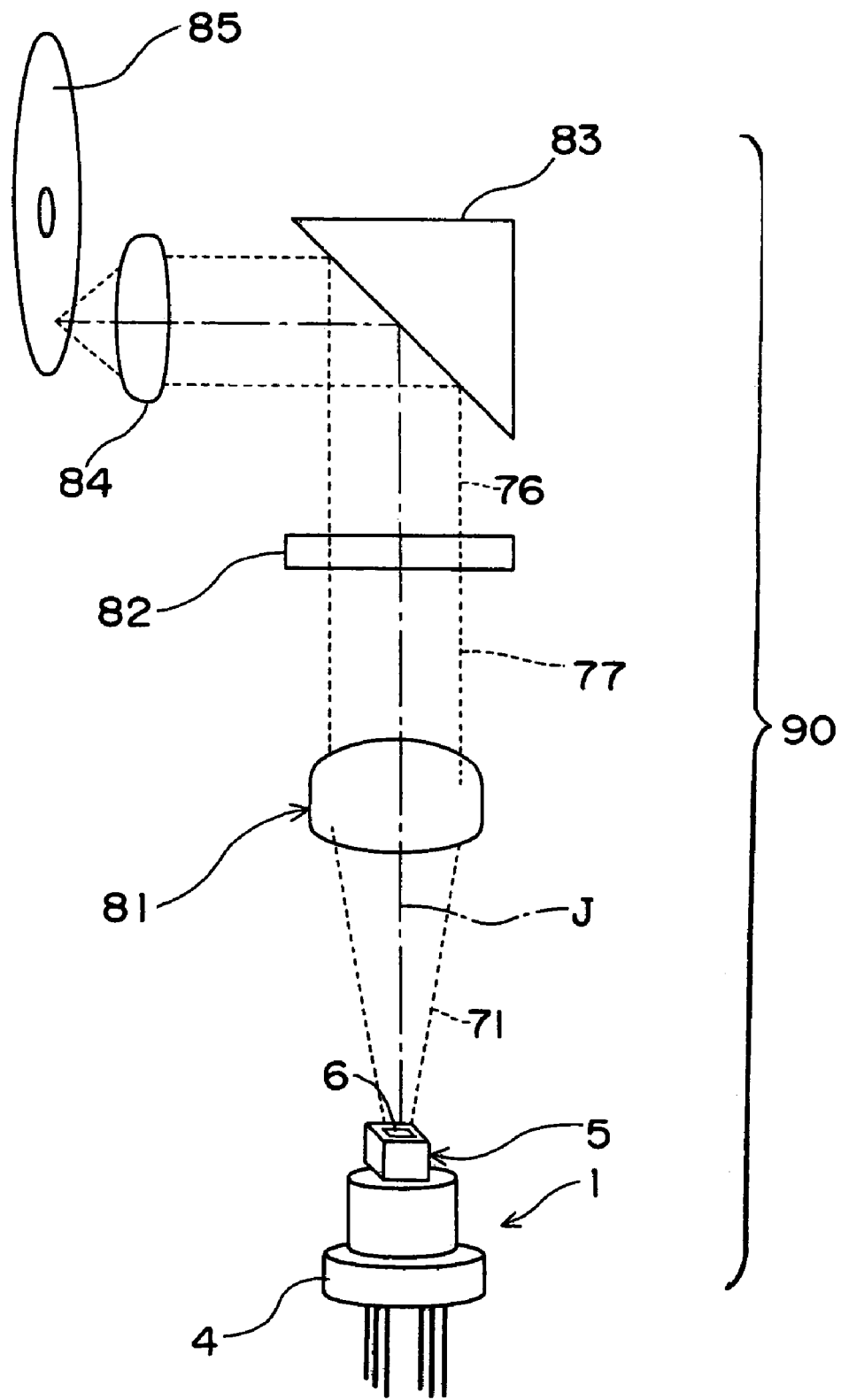
FIG. 2 is a view showing the construction of an optical pickup device equipped with the semiconductor laser device of the embodiment.

The semiconductor laser device 1 of this embodiment serves to constitute part of an optical pickup device 90 as shown in FIG. 2. This optical pickup device 90 has a ¼ wave plate 82 mounted between the polarization hologram 6 of the optical element 5 and an optical disk 85 as an optical recording medium. Also, in this optical pickup device 90, a raising mirror 83 and an objective lens 84 are disposed in this order between the ¼ wave plate 82 and the optical disk 85, and a collimator lens 81 is disposed between the optical element 5 and the ¼ wave plate 82. The collimator lens 81, the ¼ wave plate 82 and the raising mirror 83 are disposed on the output optical axis J of the semiconductor laser chip 2.

In this case, the outgoing beam 70 from the semiconductor laser chip 2 is a linearly polarized beam, and the polarization hologram 6 is given by such a polarization hologram that nearly 100% of this linearly polarized outgoing beam 70 is thereby transmitted. Accordingly, the forward beam 71 transmitted by the polarization hologram 6 is transmitted by the ¼ wave plate 82 subsequent to the collimator lens 81, becoming a circularly polarized beam 76, which goes on via the raising mirror 83 and the objective lens 84 so as to be incident on the optical disk 85. Thus, the outgoing beam 70 outputted from the semiconductor laser chip 2 can be made to efficiently go incident on the optical disk 85 via the polarization hologram 6.

Then, the reflected light at this optical disk 85 is transmitted again by the ¼ wave plate 82, becoming this time a linearly polarized beam rotated 90° from the linearly polarized beam of the forward beam 71, thus resulting in a backward beam 77. This backward beam 77 is diffractable by the polarization hologram 6.

Further, the polarization hologram 6 is set to such a groove depth that nearly 100% of the backward beam 77 is diffracted (i.e., generally 0% of 0th-order transmitted light), and moreover the first, second photoreception part 3A, 3B are provided in correspondence to the resulting ±1st-order diffracted beams 72, 73, respectively. Thus, it becomes achievable to lead the reflected light from the optical disk 85 (backward beam 77) to the first, second photoreception part 3A, 3B usefully without waste.

The forward-way outgoing beam 70 outputted by the semiconductor laser chip 2 passes through the polarization hologram 6 as a polarization diffraction grating as in the prior art. However, the outgoing beam 70 of the semiconductor laser chip 2, having a property that its polarization ratio is close to 1, can reach the optical disk 85 without any diffraction loss by the polarization hologram 6. Therefore, the performance of the semiconductor laser chip 2, which is a light-emitting device, can be utilized to the utmost for high-speed write operation onto the optical disk 85. On the other hand, since the outgoing beam 70 has been changed to a 90°-rotated linearly polarized beam as a result of twice passage through the ¼ wave plate 82 with the forward way to the optical disk 85 and the backward way after the reflection by the optical disk 85, the backward beam 77 can be subjected to a desired diffraction by the polarization hologram 6 as a polarization diffraction grating.

Further, in this embodiment, as described above, the three-beam diffraction grating 7 is so positioned that only the +1st-order diffracted beam 72 out of the ±1st-order diffracted beams 72, 73 transmitted by the polarization hologram 6 is allowed to be incident thereon.

In this connection, the +1st-order diffracted beam 72 that has passed through the three-beam diffraction grating 7 incurs occurrence of light quantity loss as a result of the diffraction at the three-beam diffraction grating 7, causing a fear for decrease of the S/N ratio. Therefore, for example, the high-band signal (RF signal), which is an information signal recorded on the optical disk 85, is detected from the −1st-order diffracted beam 73, and this −1st-order diffracted beam 73 is received by the second photoreception part 3B without passing through the three-beam diffraction grating 7. Meanwhile, a servo signal, which needs no high band, is detected from the +1st-order diffracted beam 72, and this +1st-order diffracted beam 72 is received by the first photoreception part 3A via the three-beam diffraction grating 7. By doing so, the RF signal, which is required to meet particularly high S/N ratio, is kept free from any influences of the three-beam diffraction grating 7. Thus, there can be obtained a semiconductor laser device 1 which is high in efficiency for light utilization in total.

Figure 3:
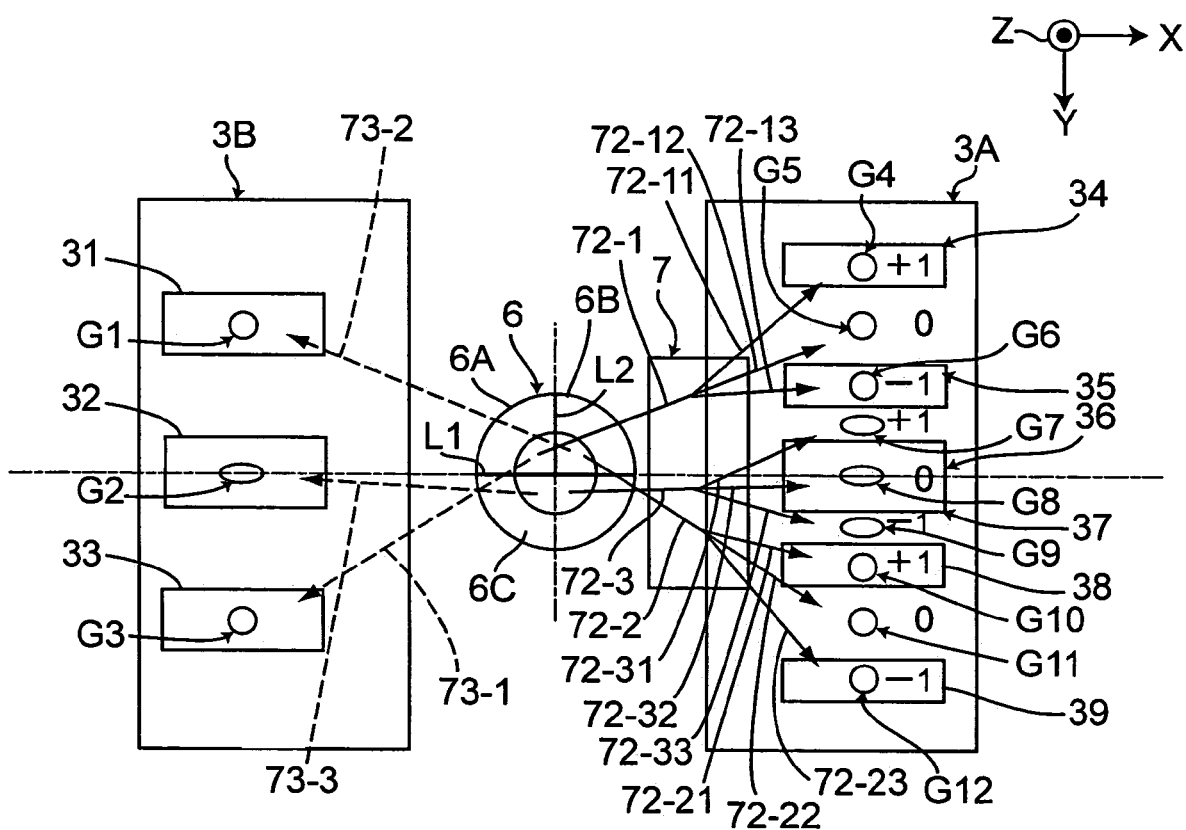
FIG. 3 is a schematic view showing the relationship between a polarization hologram 6 and photoreception parts 3A, 3B in the semiconductor laser device of the embodiment.

Next, FIG. 3 schematically shows the relationship among the polarization hologram 6, the three-beam diffraction grating 7, the first photoreception part 3A and the second photoreception part 3B in this embodiment. This FIG. 3 is only a schematic representation and, actually, the polarization hologram 6 is sized to, for example, about □3 to 4 mm, while each of the first photoreception part 3A and the second photoreception part 3B is sized to about 50 μm×200 μm. Also, the first, second photoreception parts 3A, 3B are positioned at a distance of several hundreds μm from the center of the polarization hologram 6.

As shown in FIG. 3, the polarization hologram 6 is divided into a set of a first segment 6A and a second segment 6B, and a third segment 6C by a line segment L1 which extends through the center axis (optical axis J) along a radial direction X. Further, the polarization hologram 6 is divided into the first segment 6A and the second segment 6B by a line segment L2 which extends through the center axis along a track direction Y. That is, the polarization hologram 6 is three divided into the first segment 6A, the second segment 6B and the third segment 6C by the line segments L1 and L2.

In one example of this embodiment, the second photoreception part 3B is composed of three segments, i.e., first to third photodetectors 31 to 33, while the first photoreception part 3A is composed of six segments, i.e., fourth to ninth photodetectors 34 to 39.

The backward beam 77 from the optical disk 85 is divided by this polarization hologram 6 into six beams, i.e., first, second, third −1st-order diffracted beams 73-1, 73-2, 73-3 and first, second, third +1st-order diffracted beams 72-1, 72-2, 72-3.

As shown in FIG. 3, the first −1st-order diffracted beam 73-1 diffracted by the first segment 6A of the polarization hologram 6 goes incident on the third photodetector 33 of the second photoreception part 3B, forming a spot G3. Also, the second −1st-order diffracted beam 73-2 diffracted by the second segment 6B goes incident on the first photodetector 31, forming a spot G1. Further, the third −1st-order diffracted beam 73-3 diffracted by the third segment 6C goes incident on the second photodetector 32, forming a spot G2.

The first +1st-order diffracted beam 72-1 diffracted by the first segment 6A of the polarization hologram 6 goes incident on the three-beam diffraction grating 7, being three divided into +1st-order diffracted beams 72-11, 72-12, 72-13. This +1st-order diffracted beam 72-11 goes incident on the fourth photodetector 34, forming a spot G4. Also, the +1st-order diffracted beam 72-12 goes incident on a region between the fourth photodetector 34 and the fifth photodetector 35, forming a spot G5. Further, the +1st-order diffracted beam 72-13 goes incident on the fifth photodetector 35, forming a spot G6.

Further, the second +1st-order diffracted beam 72-2 diffracted by the second segment 6B of the polarization hologram 6 goes incident on the three-beam diffraction grating 7, being three divided into +1st-order diffracted beams 72-21, 72-22, 72-23. This +1st-order diffracted beam 72-21 goes incident on the eighth photodetector 38, forming a spot G10. Also, the +1st-order diffracted beam 72-22 goes incident on a region between the eighth photodetector 38 and the ninth photodetector 39, forming a spot G11. Further, the +1st-order diffracted beam 72-23 goes incident on the ninth photodetector 39, forming a spot G12.

Further, the third +1st-order diffracted beam 72-3 diffracted by the third segment 6C of the polarization hologram 6 goes incident on the three-beam diffraction grating 7, being three divided into +1st-order diffracted beams 72-31, 72-32, 72-33. This +1st-order diffracted beam 72-31 goes incident on a region between the fifth photodetector 35 and the sixth photodetector 36, forming a spot G7. Also, the +1st-order diffracted beam 72-32 goes incident on the sixth photodetector 36 and the seventh photodetector 37, forming a spot G8. Further, the +1st-order diffracted beam 72-33 goes incident on a region between the seventh photodetector 37 and the eighth photodetector 38, forming a spot G9.

In this connection, a focus error signal (FES) is obtained from an absolute value of a difference (S6−S7) between a signal S6 outputted by the sixth photodetector 36 and a signal S7 output by the seventh photodetector 37. Also, an information signal (RF) is obtained from summation of a signal S1 outputted by the first photodetector 31, a signal S2 outputted by the second photodetector 32 and a signal S3 outputted by the third photodetector 33.

Further, a track error signal TES is obtained by a calculational equation represented by the following Equation (1):

$$TES=(S1-S3)-\alpha\times((S6+S7)-\beta\times(S4+S5+S8+S9)) \quad (1)$$

In this Equation (1), S4 represents a signal outputted by the fourth photodetector 34, S5 represents a signal outputted by the fifth photodetector 35, S8 represents a signal outputted by the eighth photodetector 38, S9 represents a signal outputted by the ninth photodetector 39, and $\alpha$, $\beta$ represent a factor i.e., constant, respectively.

Also in this Equation (1), (S1−S3) represents a push-pull signal (PP signal), and the terms following the factor a represent an offset correction signal by a shift of the objective lens.

Figure 4:
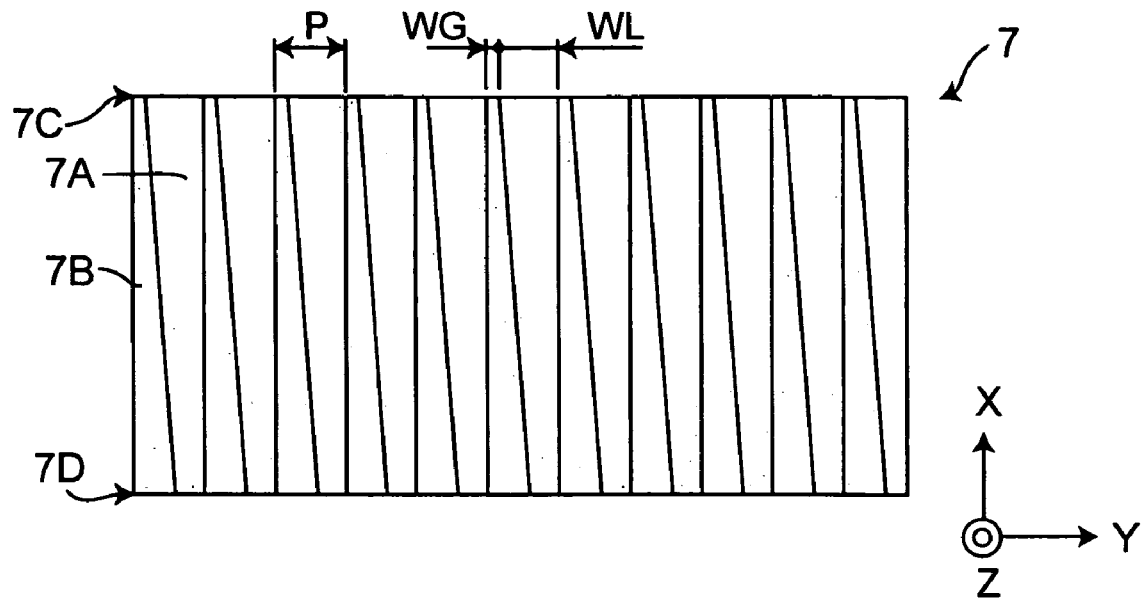
FIG. 4 is a schematic view of a three-beam diffraction grating of the semiconductor laser device 1 of the embodiment.

Next, FIG. 4 shows an example of the three-beam diffraction grating 7 adopted in this embodiment. Referring to FIG. 4, Y shows the track direction, X shows the radial direction, and Z shows the direction of the optical axis J. In this three-beam diffraction grating 7, land portions 7A and groove portions 7B are alternately arrayed along the track direction (Y direction). These land portions 7A and groove portions 7B constitute the grating.

This three-beam diffraction grating 7 has a constant grating pitch P. Also, the width (land width) WL of the land portions 7A increases toward the radial direction (X direction), while the width (groove width) WG of the groove portions 7B decreases toward the radial direction (X direction). That is, a duty represented by a ratio of the groove width WG to the land width WL continuously varies along the radial direction (X direction in the figure) of the optical disk 85. More specifically, referring to FIG. 4, the efficiency of ±1st-order diffraction continuously increases from an end portion 7C, where the groove width WG becomes a minimum, toward an end portion 7D, where the groove width WG becomes a maximum, so that the 0th-order efficiency continuously decreases. That is, at the end portion 7C where the groove width WG becomes a minimum, the ±1st-order diffraction efficiency becomes a minimum and the 0th-order efficiency becomes a maximum.

Accordingly, during the tracking, as the objective lens 84 moves in the radial direction (X direction in the figure), the diffraction efficiency at the three-beam diffraction grating 7 varies, so that an increase/decrease variation of a ±1st-order diffracted beam and an increase/decrease change of a 0th-order transmitted beam become reverse to each other. Consequently, by detecting the ±1st-order diffracted beam and the 0th-order transmitted beam at this three-beam diffraction grating 7 independently of each other, and by taking a difference between a detection signal by detection of the ±1st-order diffracted beam and a detection signal by detection of the 0th-order transmitted beam, it becomes possible to detect a shift amount of the objective lens 84 toward the radial direction.

Figure 5:
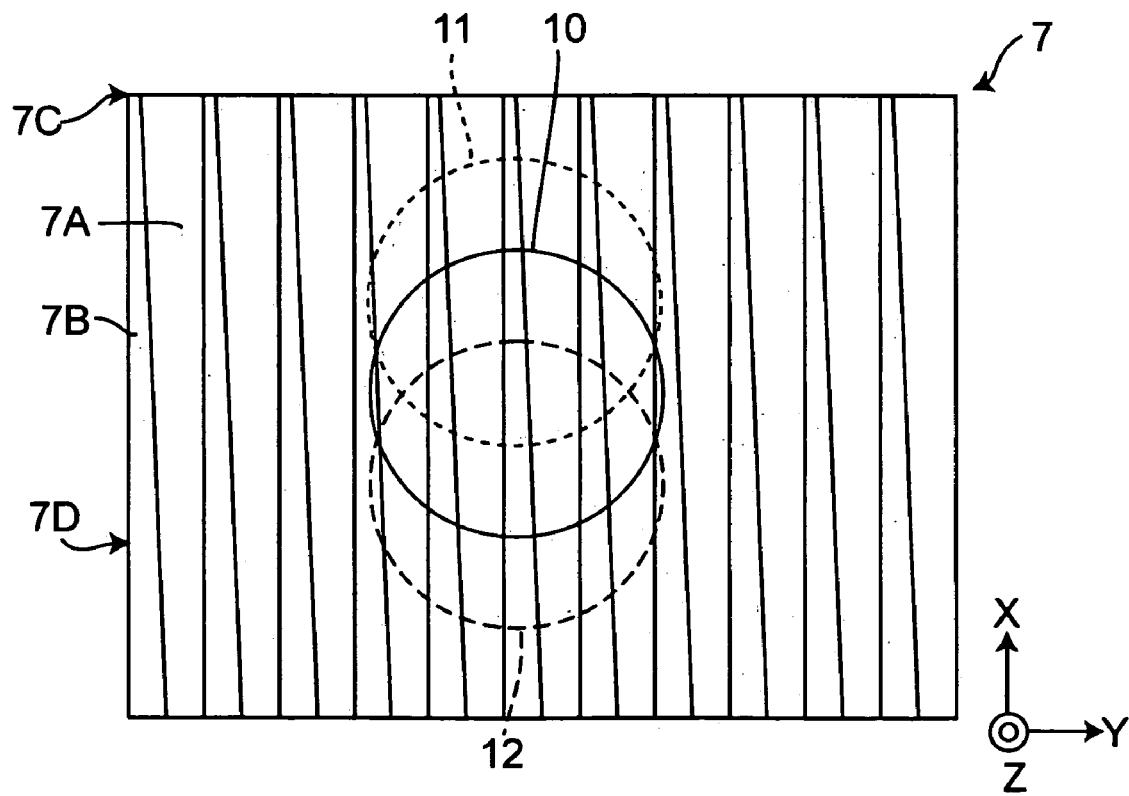
FIG. 5 is a schematic view showing transitions of disk-reflected light on the three-beam diffraction grating.

FIG. 5 shows the spot 10, in solid line, where the +1st-order diffracted beam 72 derived from the polarization hologram 6 has been incident on the three-beam diffraction grating 7 under the condition that the shift amount of the objective lens 84 toward the radial direction is 0 as an example. In this case with the shift amount of 0, given a signal S (0th-order transmitted beam) derived from the detection of the 0th-order transmitted beam at the three-beam diffraction grating 7, a signal S (+1st-order diffracted beam) derived from the detection of the +1st-order diffracted beam at the three-beam diffraction grating 7, and a signal S (−1st-order diffracted beam) derived from the detection of the −1st-order diffracted beam at the three-beam diffraction grating 7, the factor β is set so as to satisfy the following equation (2):

$$S(\text{0th-order transmitted beam}) - \beta \times \{S(+\text{1st-order diffracted beam}) + S(-\text{1st-order diffracted beam})\} = 0 \quad (2)$$

In the case where the factor β is set as shown above, if the calculational equation by the left side of Equation (2) results in a positive value, then the objective lens 84 shifts along the radial direction so that the spot 10 shifts, for example, upward in FIG. 5 (i.e., in the X (radial) direction), becoming a spot 11 depicted in dotted line. Conversely, if the calculational equation by the left side of Equation (2) results in a negative value, then it follows that the objective lens 84 has shifted so that the spot 10 shifts to a spot 12 depicted in broken line.

Referring now to the calculational equation (1) for calculating the track error signal TES, the expression (S4+S5+S8+S9) is a sum of the signals by the ±1st-order diffracted beams, and the expression (S6+S7) is a sum of the signals by the 0th-order transmitted beam. Therefore, in this calculational equation (1), the expression, α×((S6+S7)−β×(S4+S5+S8+S9)), serves to calculate the shift amount of the objective lens 84. In this equation, the factor β is a value which is determined by the grating groove depth of the three-beam diffraction grating 7 and which serves for adjustment of the difference between the diffraction efficiency for the 0th-order transmitted beam and the diffraction efficiency for the ±1st-order diffracted beams. Also, the factor α is a factor for converting a shift amount of the objective lens into an offset amount in the PP (push-pull) signal.

Further, in the case where there has occurred a radial tilt of the optical disk 85, since the spot of an incident beam is shifted in the radial direction (X direction in FIG. 5) on the three-beam diffraction grating 7, it is also possible to detect the tilt amount of the optical disk 85, as in the above case for the shift amount of the objective lens 84.

In addition, other than the foregoing Equation (1), the following Equation (3) or (4) can be used to calculate the track error signal TES:

$$TES = (S1-S3) - \alpha \times (S2 - \beta \times (S6+S7)) \quad (3)$$

$$TES = (S1-S3) - \alpha \times ((S1+S3) - \beta \times (S4+S5) + (S8+S9)) \quad (4)$$

In the foregoing Equation (1), since the calculation modified by the factor a serve to calculate the difference between signals by 0th-order transmitted beams and signals by ±1st-order diffracted beams at the three-beam diffraction grating 7, a high sensitivity for shifts of the objective lens is obtained. On the other hand, the above Equation (3) makes use of only signals by 0th-order transmitted beams out of the signals by 0th-order transmitted beams and the signals by ±1st-order diffracted beams of the three-beam diffraction grating 7. Also, the above Equation (4) makes use of only signals by ±1st-order diffracted beams out of the signals by the 0th-order transmitted beams and the signals by the ±1st-order diffracted beams of the three-beam diffraction grating 7. Therefore, in the cases where Equation (3) or Equation (4) is adopted, the sensitivity becomes lower, compared with the case where the Equation (1) is adopted. However, with the Equation (3) adopted, since the photodetectors 34, 35, 38, 39 shown in FIG. 3 become unnecessary, the scale of calculation circuits within the semiconductor laser device 1 as an integrated unit can be reduced and moreover its number of pins can be decreased, thus making it implementable to downsize the semiconductor laser device 1 as an integrated unit.

Also, in both Equation (3) and Equation (4), calculations of terms modified by the factor a are enabled by signals detected using only a one-side region (e.g., third segment 6C or first, second segments 6A, 6B) of the polarization hologram 6. Accordingly, with the foregoing Equation (3) or Equation (4) adopted, the calculated value of the track error signal TES can be made less vulnerable to influences of unbalance of the optical beam of the backward beam 77 that impinges on the polarization hologram 6 in the track direction (Y direction) even if such unbalance has occurred.

The foregoing description has been given on a case where both of the ±1st-order diffracted beams of the polarization hologram are used. However, signals included in the focusing spot G1 and signals included in the focusing spot G11 are identical to each other, signals included in the focusing spot G2 and signals included in the focusing spot G8 are identical to each other, and signals included in the focusing spot G3 and signals included in the focusing spot G5 are identical to each other. Therefore, the focusing spots G1, G2, G3 may be eliminated. In such a case, indeed the magnitude of signals decreases, but the need for the second photoreception part 3B is eliminated, thus making it possible to achieve a reduction in equipment cost.

Figure 8:
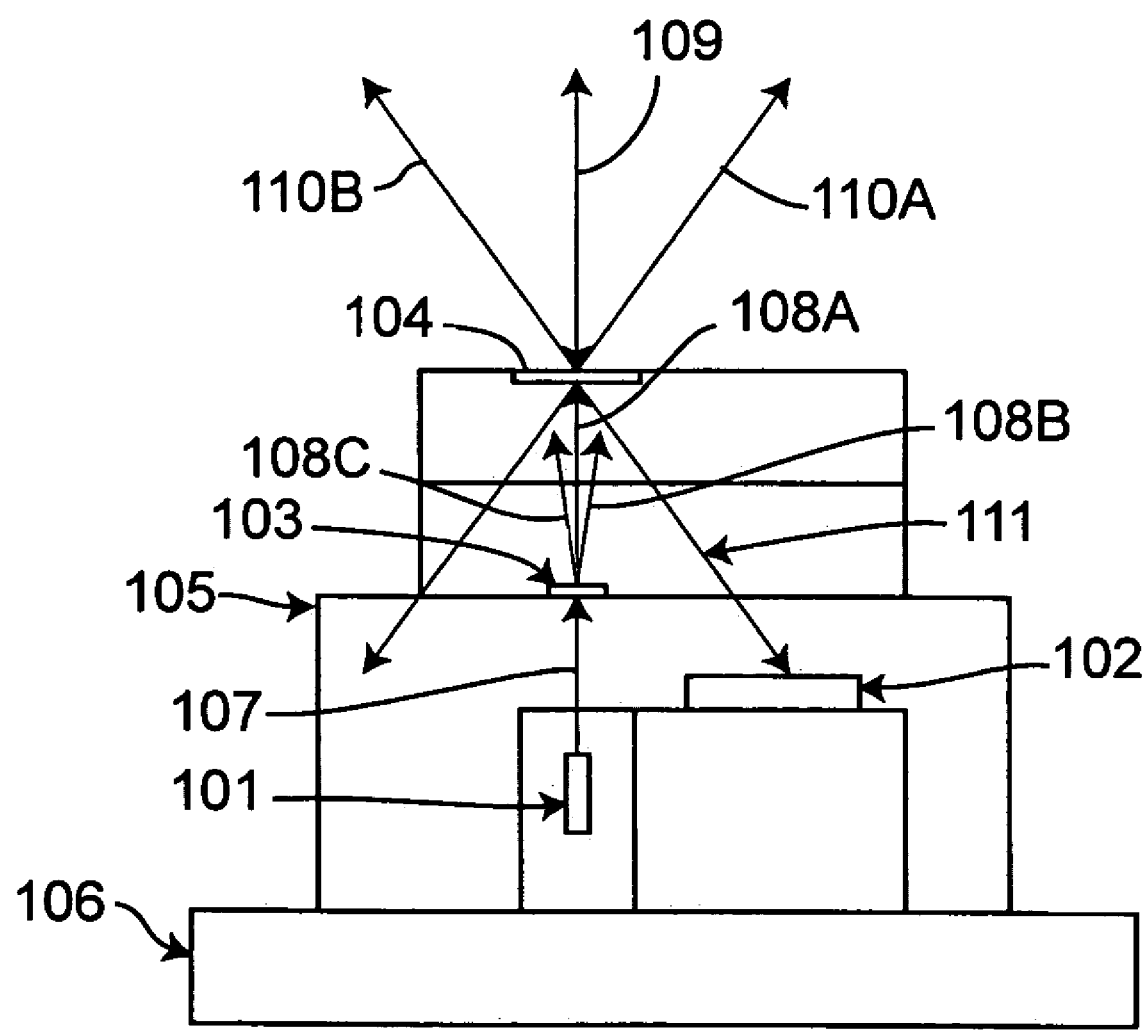
FIG. 8 is a view outlining the construction of a semiconductor laser device according to a prior art.

If the hologram 104 is implemented by a polarization hologram in FIG. 8, diffracted beams of ±1st or higher orders substantially would not occur on the forward way by the hologram element 104, so that the efficiency for light utilization could be increased. However, since ±1st-order diffracted beams would be generated by the grating device, there would occur sub-beams on both sides of the focusing spots G1, G2, G3 in FIG. 3, respectively, even though the hologram element 104 is a polarization hologram, resulting in worse efficiency for light utilization than the present invention. Further, as a similar constitution, an example in which a polarization beam splitter is used instead of a polarization hologram is disclosed in JP 2001-273666A.

Figure 6:
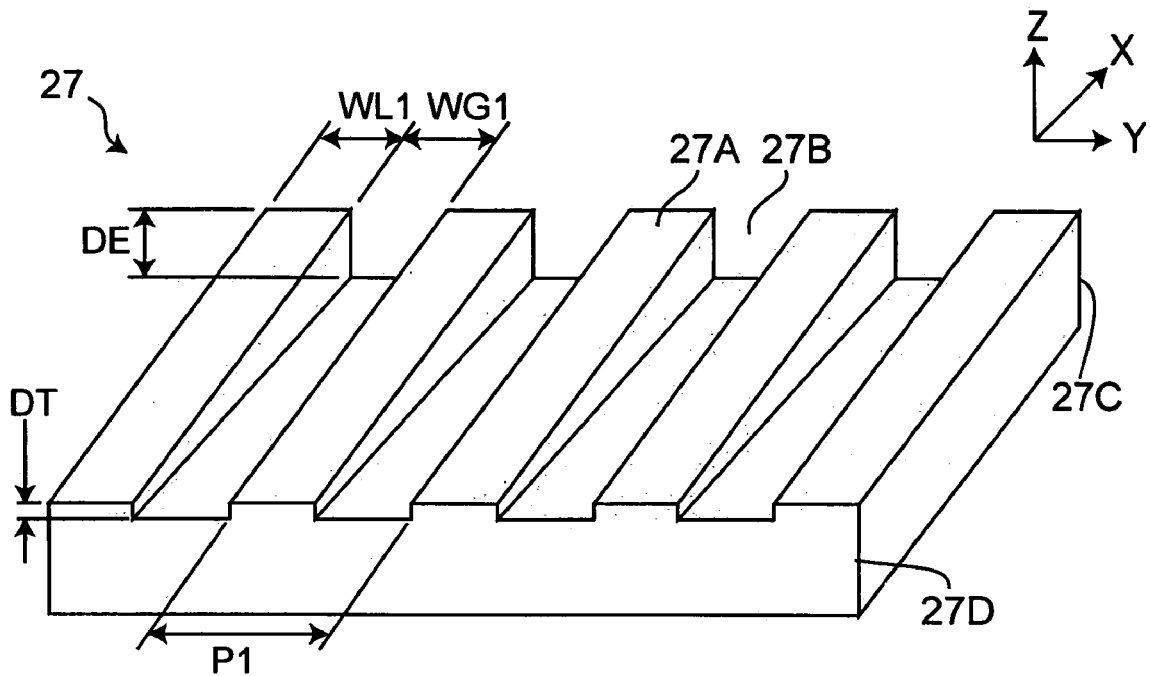
FIG. 6 is a schematic view showing a modification of the three-beam diffraction grating.

Next, FIG. 6 shows a three-beam diffraction grating 27 of another construction having the same effects as the three-beam diffraction grating 7 shown in FIG. 4. This three-beam diffraction grating 27 has land portions 27A and groove portions 27B. In this three-beam diffraction grating 27, its grating pitch P1 is constant, and its groove width WG1 and land width WL1 are constant. Further, a duty represented by a ratio of the groove width WG1 to the land width WL1 is constant. In this three-beam diffraction grating 27, on the other hand, the groove depth of the groove portions 27B continuously increases along the radial direction (X direction in the figure) from one end 27D of a groove depth DT toward the other end 27C of a groove depth DE.

In this three-beam diffraction grating 27, the diffraction efficiency continuously varies along the radial direction (X direction in the figure) from the one end 27D of the groove depth DT toward the other end 27C of the groove depth DE. Therefore, in this three-beam diffraction grating 27, shift amount of the objective lens can be detected by using a signal S (0th-order transmitted beam) derived from the detection of the 0th-order transmitted beam, a signal S (+1st-order diffracted beam) derived from the detection of the +1st-order diffracted beam, and a signal S (−1st-order diffracted beam) derived from the detection of the −1st-order diffracted beam at the three-beam diffraction grating 27 according to a calculational expression, [S(0th-order transmitted beam)−β×{S(+1st-order diffracted beam)+S(−1st-order diffracted beam)}] as in the case of the three-beam diffraction grating 7.

Figure 7:
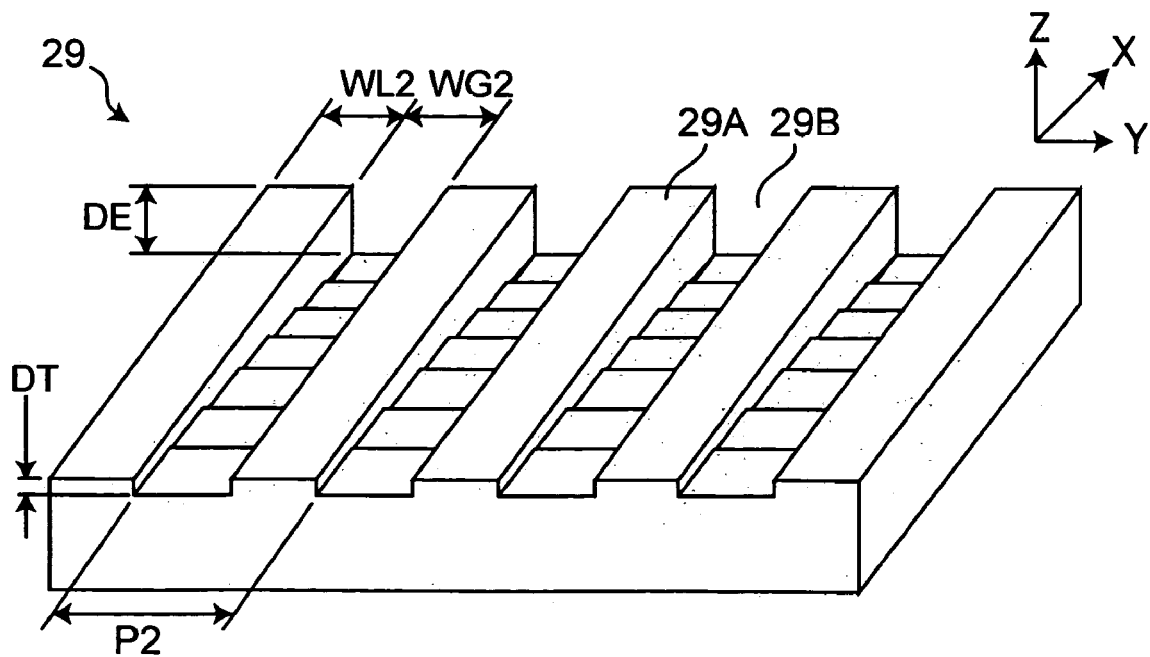
FIG. 7 is a schematic view showing another modification of the three-beam diffraction grating.

Also, FIG. 7 shows another three-beam diffraction grating 29 as a modification of the three-beam diffraction grating 7. This three-beam diffraction grating 29 has land portions 29A and groove portions 29B. In this three-beam diffraction grating 29, its grating pitch P2 is constant, and its groove width WG2 and land width WL2 are constant. Further, a duty represented by a ratio of the groove width WG2 to the land width WL2 is constant. On the other hand, the groove depth of the groove portions 29B increases stepwise along the radial direction (X direction in the figure) from a groove depth DT of one end 29D to a groove depth DE of the other end 29C. Effects by this three-beam diffraction grating 29 are similar to those of the three-beam diffraction grating 27, and the diffraction efficiency varies depending on the groove depth of individual portions of the groove portions 29B. Therefore, shift amount of the objective lens can be detected by using a signal S (0th-order transmitted beam) derived from the detection of the 0th-order transmitted beam and a signal S (+1st-order diffracted beam) derived from the detection of the +1st-order diffracted beam, and a signal S (−1st-order diffracted beam) derived from the detection of the −1st-order diffracted beam at the three-beam diffraction grating 29 according to a calculational expression, [S(0th-order transmitted beam)−β×{S(+1st-order diffracted beam)+S(−1st-order diffracted beam)}].

Thus, according to the semiconductor laser device 1 of this embodiment, it becomes possible to correct offsets that occur due to shifts of the objective lens 84 or tilts of the optical disk 85 in a one-beam method in which there occurs no decrease of light quantity of the main beam by the semiconductor laser chip 2, so that stable track servo performance can be obtained.

Also, as shown in FIG. 2, an optical pickup device 90 is made up by combining such optical elements as this semiconductor laser device 1, the collimator lens 81, the ¼ wave plate 82, the raising mirror 83, and the objective lens 84 for focusing a laser beam (forward beam 71), which is outputted from this semiconductor laser device 1, onto the optical disk 85. Accordingly, the optical pickup device 90 can be made up with the necessary smallest number of optical components.

Thus, according to this optical pickup device 90, since the adjustment for the signal detection system is no longer necessary, there can be realized with simplicity an optical pickup device 90 which is small and thin in size, good at assemblability and excellent in reliability as well and which exhibits a stable track servo performance.

Also, for this optical pickup device 90, it has been made achievable to reduce the power loss of the semiconductor laser chip 2 during write operations onto the disk and to achieve higher write speeds by adopting the polarization hologram 6, which is a polarization diffraction grating, as a diffraction grating for use of backward-beam diffraction, without disposing a three-beam division use grating for obtaining a tracking signal on the forward way.

In the semiconductor laser device 1 of the above embodiment, the polarization hologram 6 is provided as a polarization diffraction grating. However, even when a polarization blazed diffraction grating is provided instead of the polarization hologram 6, higher-speed write operations can be implemented by reducing the optical loss of the outgoing beam 70 outputted by the semiconductor laser chip 2 on the forward way, as in the above embodiment. It is noted that, in this case, the tracking is given by the push-pull method. In addition, the optical disk 85 generically refers to optical recording mediums for performing reproduction or recording with use of light, such as pit disks for exclusive use of reproduction, phase-change disks capable of recording, erase and reproduction, magnet-optical disks, or rewritable disks capable of recording and reproduction.

As apparent from the above description, according to the semiconductor laser device of the present invention, the polarization hologram transmits a laser beam directed from the laser emission part to the irradiation object as a forward beam without diffracting the beam, and diffracts the backward beam of the laser beam, which is a return beam of the forward beam that has been reflected by the irradiation object so that the backward beam is deflected from a direction directed toward the laser emission part and moreover directed toward the laser reception part. Consequently, according to the present invention, optical loss on the forward way from the laser emission part can be reduced, and moreover return light to the laser emission part can be suppressed, thus making it possible to realize a high-power, high-sensitivity semiconductor laser device.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor laser device comprising:
a laser emission part for emitting a laser beam;
laser reception parts for receiving a backward beam of the laser beam reflected by an irradiation object;
a polarization hologram for transmitting the laser beam directed from the laser emission part to the irradiation object as a forward beam without diffracting the laser beam, and diffracting the backward beam of the laser beam, which is a return beam of the forward beam that has been reflected by the irradiation object, and dividing the backward beam into plural holographic diffracted beams so that the holographic diffracted beams are deflected from a direction directed toward the laser emission part and further directed toward the laser reception parts;
a three-beam diffraction grating for dividing one of the holographic diffracted beams, which result from the diffraction of the backward beam by the polarization hologram, into three beams and for letting the three beams incident on the laser reception part; and
wherein the three-beam diffraction grating is not located in a forward path of the forward beam between the laser emission part and the polarization hologram, and wherein the three-beam diffraction grating is located only in a backward path of one of the holographic diffracted beams.

2. The semiconductor laser device according to claim 1, wherein the polarization hologram and the three-beam diffraction grating are integrated together.

3. The semiconductor laser device according to claim 1, wherein the three-beam diffraction grating is so positioned that the forward beam directed from the laser emission part toward the irradiation object is inhibited from being incident on the three-beam diffraction grating.

4. The semiconductor laser device according to claim 1, wherein the laser reception part includes a first photoreception part for receiving a +1st-order diffracted beam derived from the polarization hologram, and a second photoreception part for receiving a −1st-order diffracted beam derived from the polarization hologram.

5. The semiconductor laser device according to claim 1, wherein the three-beam diffraction grating varies in diffraction efficiency depending on positions in a grating-extension direction along which the grating extends.

6. The semiconductor laser device according to claim 5, wherein in the three-beam diffraction grating, a land width to groove width ratio of land portions and groove portions which constitute the grating continuously varies along the grating-extension direction.

7. The semiconductor laser device according to claim 5, wherein in the three-beam diffraction grating, groove depth of the grating continuously varies along the grating-extension direction.

8. The semiconductor laser device according to claim 5, wherein in the three-beam diffraction grating, groove depth of the grating varies stepwise along the grating-extension direction.

9. The semiconductor laser device of claim 1, wherein no portion of the three-beam diffraction grating overlaps the center of the polarization hologram when viewed from above or below.

10. An optical pickup device comprising:
a laser emission part for outputting a laser beam;
laser reception parts for receiving a backward beam of the laser beam reflected by an optical disk;
a polarization hologram for transmitting the laser beam directed from the laser emission part to the optical disk as a forward beam without diffracting the laser beam, and diffracting the backward beam of the laser beam, which is a return beam of the forward beam that has been reflected by the optical disk, and dividing the backward beam into plural holographic diffracted beams so that the holographic diffracted beams are deflected from a direction directed toward the laser emission part and further directed toward the laser reception part;
a ¼ wave plate corresponding to a wavelength of the laser beam
an objective lens for focusing the laser beam onto the optical disk;
a three-beam diffraction grating for dividing one of the holographic diffracted beams, which results from the diffraction of the backward beam by the polarization hologram, into three beams and for letting the three beams incident on the laser reception part;
wherein the three-beam diffraction grating is not located in a forward path of the forward beam between the laser emission part and the polarization hologram; and
wherein the three-beam diffraction grated is located in a backward path of only one of the holographic diffracted beams.

11. A semiconductor laser device comprising:
a laser emission part for emitting a laser beam;
laser reception parts for receiving a backward beam of the laser beam reflected by an irradiation object;
a hologram for transmitting the laser beam directed from the laser emission part to the irradiation object as a forward beam without diffracting the laser beam, and diffracting the backward beam of the laser beam, which is a return beam of the forward beam that has been reflected by the irradiation object, and dividing the backward beam into plural holographic diffracted beams so that the holographic diffracted beams are deflected from a direction directed toward the laser emission part and further directed toward the laser reception parts;
a three-beam diffraction grating for dividing one of the holographic diffracted beams, which result from the diffraction of the backward beam by the hologram, into three beams and for letting the three beams incident on the laser reception part; and
wherein the three-beam diffraction grating is not located in a forward path of the forward beam between the laser emission part and the hologram, and wherein the three-beam diffraction grating is located only in a backward path of one of the holographic diffracted beams.

12. The semiconductor laser device of claim 11, wherein no portion of the three-beam diffraction grating overlaps the center of the hologram when viewed from above or below.

13. An optical pickup device comprising:

a laser emission part for outputting a laser beam;

laser reception parts for receiving a backward beam of the laser beam reflected by an optical disk;

a hologram for transmitting the laser beam directed from the laser emission part to the optical disk as a forward beam without diffracting the laser beam, and diffracting the backward beam of the laser beam, which is a return beam of the forward beam that has been reflected by the optical disk, and dividing the backward beam into plural holographic diffracted beams so that the holographic diffracted beams are deflected from a direction directed toward the laser emission part and further directed toward the laser reception parts;

a ¼ wave plate corresponding to a wavelength of the laser beam an objective lens for focusing the laser beam onto the optical disk;

a three-beam diffraction grating for dividing one of the holographic diffracted beams, which results from the diffraction of the backward beam by the hologram, into three beams and for letting the three beams incident on the laser reception part;

wherein the three-beam diffraction grating is not located in a forward path of the forward beam between the laser emission part and the hologram; and wherein the three-beam diffraction grated is located in a backward path of only one of the holographic diffracted beams.

* * * * *